(12) United States Patent
Johnson et al.

(10) Patent No.: US 11,139,426 B2
(45) Date of Patent: Oct. 5, 2021

(54) ACTUATOR DEVICE BASED ON AN ELECTROACTIVE POLYMER

(71) Applicant: KONINKLIJKE PHILIPS N.V., Eindhoven (NL)

(72) Inventors: Mark Thomas Johnson, Eindhoven (NL); David Andrew Fish, Eindhoven (NL)

(73) Assignee: KONINKLIJKE PHILIPS N.V., Eindhoven (NL)

(*) Notice: Subject to any disclaimer, the term of this patent is extended or adjusted under 35 U.S.C. 154(b) by 695 days.

(21) Appl. No.: 15/774,337

(22) PCT Filed: Dec. 9, 2016

(86) PCT No.: PCT/EP2016/080369
§ 371 (c)(1),
(2) Date: May 8, 2018

(87) PCT Pub. No.: WO2017/108443
PCT Pub. Date: Jun. 29, 2017

(65) Prior Publication Data
US 2020/0251646 A1 Aug. 6, 2020

(30) Foreign Application Priority Data
Dec. 21, 2015 (EP) .................. 15201565

(51) Int. Cl.
*H01L 41/04* (2006.01)
*H01L 41/09* (2006.01)
(Continued)

(52) U.S. Cl.
CPC ........ *H01L 41/042* (2013.01); *H01L 41/0926* (2013.01); *H01L 41/193* (2013.01); *H02N 2/06* (2013.01)

(58) Field of Classification Search
CPC ..... H01L 41/042; H01L 41/09; H01L 41/193; H01L 41/0926
(Continued)

(56) References Cited

U.S. PATENT DOCUMENTS 8,552,846 B2 * 10/2013 Cordoba Matilla . G09B 21/003
340/407.1
2015/0085180 A1 3/2015 Gleason et al.

FOREIGN PATENT DOCUMENTS

JP H11-356066 A 12/1999
JP 2006246659 A 9/2006
(Continued)

OTHER PUBLICATIONS

D. Fish, N. Young, P. Collins M. Ponjee, A. Hoevenaars, W. van Beek, C. Lasance M. Trainor, F. Gonzalez-Rodriguez, H. Gokgurler, 'A Novel LTPS Application: A multiplexed thermal array for DNA amplification', Proc. SID 2009, 33.4, 40 p. 471, 2009.

*Primary Examiner* — Derek J Rosenau
(74) *Attorney, Agent, or Firm* — Schott, P.C.

(57) ABSTRACT

An active matrix array of electroactive polymer actuators is provided, each electroactive polymer actuator having a switching arrangement. The switching arrangement comprises a first circuit (90) connected to a first terminal of the electroactive polymer actuator, for selectively driving the first terminal of the electroactive polymer actuator to ground or connecting it to an open circuit. A second circuit (92) is connected to a second terminal of the electroactive polymer actuator, for selectively driving the second terminal of the electroactive polymer actuator to ground or connecting it to an open circuit. Furthermore, a pull-up component (50) is permanently connected between a drive voltage and the first terminal of the electroactive polymer generator. By controlling both terminals of the electroactive polymer actuator, it
(Continued)

is possible to reduce static power consumption, at least when no voltage is to be stored across the electroactive polymer actuator.

10 Claims, 13 Drawing Sheets

(51) Int. Cl.
*H01L 41/193* (2006.01)
*H02N 2/06* (2006.01)

(58) Field of Classification Search
USPC .................................................. 310/314, 317
See application file for complete search history.

(56) References Cited

FOREIGN PATENT DOCUMENTS

| | | | |
|---|---|---|---|
| JP | 2009-050146 | A | 3/2009 |
| JP | 2014052586 | A | 3/2014 |
| JP | 2014-235133 | A | 12/2014 |
| WO | 2008020374 | A2 | 2/2008 |
| WO | 2015045605 | A1 | 4/2015 |

* cited by examiner

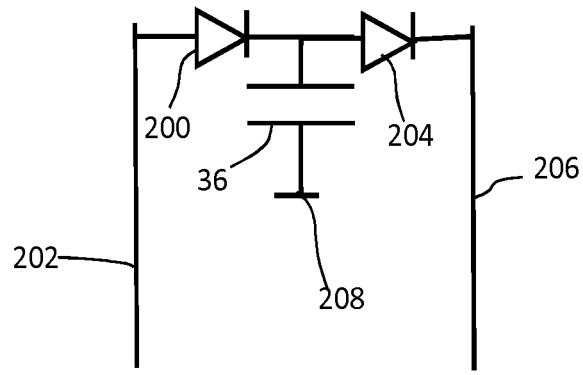
FIG. 20
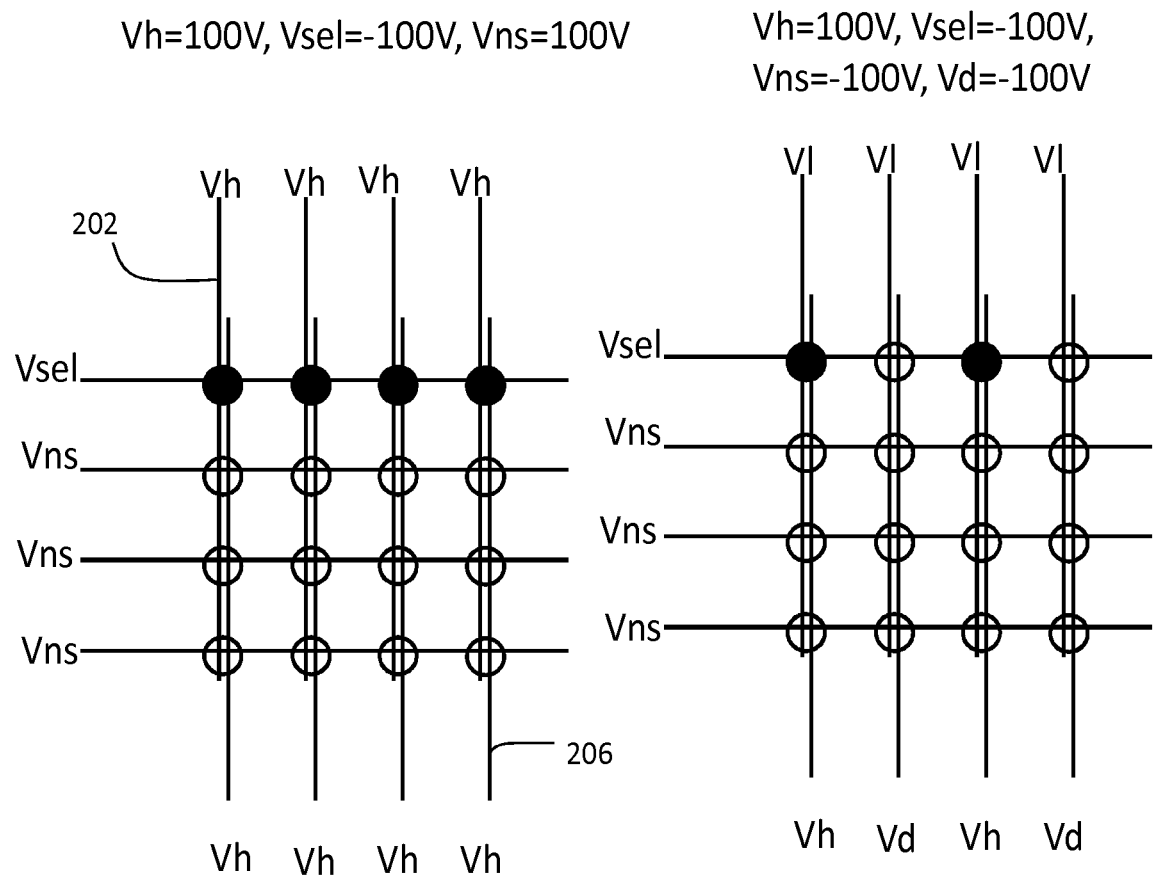
FIG. 21A
FIG. 21B

US 11,139,426 B2

ACTUATOR DEVICE BASED ON AN ELECTROACTIVE POLYMER

CROSS-REFERENCE TO PRIOR APPLICATIONS

This application is the U.S. National Phase application under 35 U.S.C. § 371 of International Application No. PCT/EP2016/080369, filed on Dec. 9, 2016, which claims the benefit of EP Patent Application No. EP 15201565.7, filed on Dec. 21, 2015. These applications are hereby incorporated by reference herein.

FIELD OF THE INVENTION

This invention relates to actuator devices which make use of electroactive polymers.

BACKGROUND OF THE INVENTION

Electroactive polymers (EAP) are an emerging class of materials within the field of electrically responsive materials. EAP's can work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP material give rise to applicability to new applications.

An EAP device can be used in any application in which a small amount of movement of a component or feature is desired, based on electric actuation. Similarly, the technology can be used for sensing small movements.

The use of EAPs enables functions which were not possible before, or offers a big advantage over common sensor/actuator solutions, due to the combination of a relatively large deformation and force in a small volume or thin form factor, compared to common actuators. EAPs also give noiseless operation, accurate electronic control, fast response, and a large range of possible actuation frequencies, such as 0-20 kHz.

Devices using electroactive polymers can be subdivided into field-driven and ionic-driven materials.

Examples of field-driven EAPs are dielectric elastomers, electrostrictive polymers (such as PVDF based relaxor polymers or polyurethanes) and liquid crystal elastomers (LCE).

Examples of ionic-driven EAPs are conjugated polymers, carbon nanotube (CNT) polymer composites and Ionic Polymer Metal Composites (IPMC).

Field-driven EAP's are actuated by an electric field through direct electromechanical coupling, while the actuation mechanism for ionic EAP's involves the diffusion of ions. Both classes have multiple family members, each having their own advantages and disadvantages.

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the electroactive polymer, or it may result from asymmetry in the properties of the carrier layer, or a combination of both.

In certain applications, an array of actuators can be useful, for instance in positioning systems and controlled topology surfaces. However, as the driving voltages of the actuators are fairly high it quickly becomes expensive to drive each actuator individually with its own driver IC.

A passive matrix array is a simple implementation of an array driving system using only row (n rows) and column (m columns) connections. As only (n+m) drivers are required to address up to (n×m) actuators, this is a far more cost effective approach—and also saves cost and space of additional wiring.

Ideally, in a passive matrix device, each individual actuator should be actuated up to its maximum voltage without influencing the adjacent actuators. However, in arrays of traditional EAP actuators (without any voltage threshold behavior) some cross talk to adjacent actuators will be present. When voltage is applied to actuate one actuator, the actuators around it also experience a voltage and will partially actuate, which is an unwanted effect for many applications.

This situation is for example described in U.S. Pat. No. 8,552,846, which discloses a passive matrix driving of EAPs without a threshold voltage or bistability. In the approach disclosed, a best actuation contrast ratio of 3:1 is achieved (i.e. "non-actuated" actuators show 33% of maximum actuation). This gives a 9:1 contrast ratio to the pressure level since the applied pressure scales with $V^2$. This approach also only works for 2 level driving.

Hence, with a passive matrix addressing scheme it is not straightforward to individually address each actuator independently of the others.

The use of an active matrix for addressing arrays of electroactive polymer actuators has been contemplated, for example for electronic braille applications. An active matrix approach involves providing a switching device at each electroactive polymer actuator, at the intersection of a row conductor and a column conductor. In this way, each actuator in the array can—if desired—be individually actuated. An active matrix addressing scheme means it is possible to have any random pattern of actuators in the array actuated at the same time.

SUMMARY OF THE INVENTION

A problem arises that the switching device, for example transistor, needs to be able to withstand the high actuation voltages required to drive the electroactive polymer actuators. Many EAP designs have actuation voltages of hundreds of volts, which is far above the possible voltages which can be handled by existing transistors suitable for integration into an array device. Thus, a conventional active matrix addressing scheme is only suitable for driving electroactive polymer actuators with particularly low actuation voltages, for example up to around 40V if thin film transistors are used as the switching elements. Above this voltage there will be leakage across the switching TFT driving transistor. Polysilicon transistors will have lower voltage limits, for example 20V.

There is therefore a need for an active matrix addressing scheme which enables relatively low voltage switching devices to be used for actuating relative high voltage electroactive polymer actuators.

It is an object of the invention to address the aforementioned problem and fulfill the aforementioned need. The object is at least partly achieved with the invention as defined by the independent claims. The dependent claims define advantageous embodiments. The invention is defined by the claims.

According to examples in accordance with an aspect of the invention, there is provided an actuator device comprising:

an active matrix array of electroactive polymer actuators, each electroactive polymer actuator having a switching arrangement, wherein the switching arrangement comprises:

a first circuit connected between a first terminal of the electroactive polymer actuator and ground, for selectively driving the first terminal of the electroactive polymer actuator to ground or connecting it to an open circuit;

a second circuit connected between a second terminal of the electroactive polymer actuator and ground, for selectively driving the second terminal of the electroactive polymer actuator to ground or connecting it to an open circuit; and a pull up component permanently connected between a drive voltage and the first terminal of the electroactive polymer actuator.

By driving both terminals of the electroactive polymer actuator it becomes possible to store a voltage across the actuator and then to provide a floating terminal so that current cannot flow through the device. This reduces static power consumption.

The first and second circuits may each comprise a set of series-connected transistors between the respective terminal of the electroactive polymer actuator and ground. By providing a series set of transistors down to ground, each transistor may experience a voltage (at its gate, or across its gate-source or across its gate-drain) which is small compared to the drive voltage of the electroactive polymer device.

The series-connected transistors are for example n-type transistors.

A second pull up component may be connected between a second drive voltage and the second terminal of the electroactive polymer actuator. This means that the two terminals may each be driven to at least two different voltages. In turn, this enables a three level driving scheme to be implemented, even with only two different drive levels provided to the circuit as a whole.

The drive voltage and the second drive voltage may be the same voltage. In this case, a positive or negative voltage may be provided across the device so that an inversion driving scheme is possible.

The drive voltage and the second drive voltage may be different. In this case, a three level drive scheme all of the same polarity may be provided.

The first and second circuits may each comprise:

an addressing transistor and a storage capacitor for providing a data voltage to the gate of a first one of the series-connected transistors; and a bias control circuit for controlling the gate voltages of the other ones of the series connected transistors.

This enables storage of a drive level in the circuit.

The bias control circuit of each of the first and second circuits may comprise:

a bias voltage coupled to the gate of a second one of the series-connected transistors; and a set of control transistors with a respective transistor connected between the gates of each adjacent pair of the other ones of the series-connected transistors.

By connecting the gates together, all transistors may be turned on together (with the bias voltage) to provide a path to ground.

The control transistors may be p-type transistors.

The transistors are for example thin film transistors, for example low temperature polysilicon transistors.

By way of example, maximum source-drain voltage may be less than 50V, for example less than 40V and possibly even less than 25V, whereas the maximum voltage to be provided across the electroactive polymer device is more than 50V, for example more than 60V, possibly more than 70V and possibly more than 80V. The gate source and gate drain voltages may also each be limited to the voltage levels listed above, so that in a particular design, the maximum voltage may apply to all three of the gate source, gate drain and drain source voltages.

Examples in accordance with another aspect of the invention provide a method of actuating a device which comprises an active matrix array of electroactive polymer actuators, each electroactive polymer actuator having a switching arrangement, wherein the switching arrangement comprises a first circuit connected between a first terminal of the electroactive polymer actuator and ground, for selectively driving the first terminal of the electroactive polymer actuator to ground or connecting it to an open circuit and a second circuit connected between a second terminal of the electroactive polymer actuator and ground, for selectively driving the second terminal of the electroactive polymer actuator to ground or connecting it to an open circuit, wherein the method comprises:

storing a non-zero voltage across the electroactive polymer actuator by:
  driving the first terminal to an actuation voltage with the first circuit driven to an open circuit and driving the second terminal to ground with the second circuit; and
storing a zero voltage across the electroactive polymer by:
  driving the first and second terminals to ground with first and second circuits; and subsequently driving the first and second circuits to an open circuit.

When driving both terminals to ground, the circuits are subsequently made open circuit so that there is no longer a path to ground through the electroactive polymer actuator. In this way, static power consumption is reduced.

Driving the first terminal to the actuation voltage may comprise applying a drive voltage to the first terminal through a pull up component. This may for example comprise a resistor.

The method may comprise, after driving the first terminal to an actuation voltage with the first circuit driven to an open circuit and driving the second terminal to ground with the second circuit, driving the second circuit to an open circuit.

In this way, the static power consumption may be reduced when the electroactive polymer actuator is driven to its actuation voltage.

The method may further comprise storing a second voltage across the electroactive polymer actuator by:
    driving the second terminal to a second actuation voltage with the second circuit driven to an open circuit and driving the first terminal to ground with the first circuit.

In this way, the voltage on both terminals may be controlled so that a three-level drive scheme is implemented.

Driving the second terminal to the second actuation voltage may comprise applying a second drive voltage to the second terminal through a second pull up component.

The second drive voltage may be the same as the drive voltage or the second drive voltage and the drive voltage may be different.

For example, the method may comprise alternately providing opposite polarity drive voltages on the electroactive polymer actuator. This provides an inversion drive scheme.

BRIEF DESCRIPTION OF THE DRAWINGS

Examples of the invention will now be described in detail with reference to the accompanying drawings, in which:

FIG. 20 shows a drive circuit for an electroactive polymer actuator using diodes;

FIG. 21 is used to explain the addressing sequence using the circuit of FIG. 20;

DETAILED DESCRIPTION OF THE EMBODIMENTS

The invention provides an active matrix array of electroactive polymer actuators, each electroactive polymer actuator having a switching arrangement. The actuator comprises an electroactive polymer structure for providing a mechanical actuation such that the structure defines a non-actuated state and at least one actuated state (different from the non-actuated state) attainable by application of an electrical drive signal to the electroactive polymer structure. The electroactive polymer structure thereto comprises and EAP material. Such material is capable of inducing or allowing a mechanical deformation upon subjecting it to an electrical signal that can be provided in the form of an electrical drive signal to the structure. The actuator or structure can have an electrode arrangement for providing the drive signal to the EAP material. The electrode structure can be attached to the EAP material directly or with intermediate layers in between. The EAP material layer of each unit may be sandwiched between electrodes of the electrode structure. Alternatively, electrodes can be on a same side of the EAP material. In either case, electrodes can be physically attached to the EAP material either directly without any (passive) layers in between, or indirectly with additional (passive) layers in between. But this need not always be the case. For relaxor or permanent piezoelectric or ferroelectric EAPs, direct contact is not necessary. In the latter case electrodes in the vicinity of the EAPs suffices as long as the electrodes can provide an electric field to the EAPs, the Electroactive polymer structure will have its actuation function. The electrodes may be stretchable so that they follow the deformation of the EAP material layer.

The switching arrangement comprises a first circuit connected to a first terminal of the electroactive polymer actuator, for selectively driving the first terminal of the electroactive polymer actuator to ground or connecting it to an open circuit. A second circuit is connected to a second terminal of the electroactive polymer actuator, for selectively driving the second terminal of the electroactive polymer actuator to ground or connecting it to an open circuit. By controlling both terminals of the electroactive polymer actuator, it is possible to reduce static power consumption, at least when no voltage is to be stored across the electroactive polymer actuator.

Figure 3:
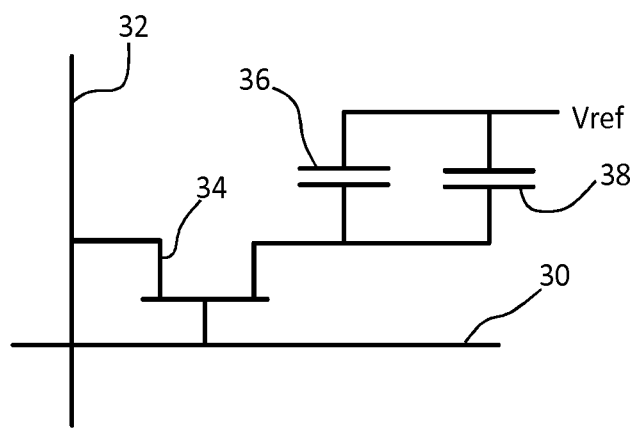
FIG. 3 shows a generic active matrix circuit for one electroactive polymer actuator.

FIG. 3 shows a generic active matrix circuit for use in an array of electroactive polymer actuators. The array is arranged in rows and columns with row conductors 30 and column conductors 32. There are preferably plural rows and columns, so that at the minimum there is then a 2×2 array. There may be many rows and columns, for example tens or hundreds of rows and/or columns. A circuit as in FIG. 3 is at each intersection (i.e. cross over) of the row and column conductors. The circuit comprises a transistor 34 such as a field effect thin film transistor, with its gate connected to the row conductor 30 and its source connected to the column conductor 32. The transistor is turned on by a select pulse on the row conductor, and it then couples the voltage on the column conductor 32 to the electroactive polymer actuator 36 and to a storage capacitor 38.

There is an array of m×n electroactive polymer actuators each driven by an active driving circuit as shown in FIG. 3. There are m row conductors (addressing lines) and n column conductors (data lines), where n≥2 and m≥2, for example n≥4 or n≥10 or n≥50 and/or m≥4 or m≥10 or m≥50. The first electrode of the electroactive polymer actuator 36 is a driving electrode. The second electrode of the electroactive polymer actuator is connected to a reference voltage Vref which may be common to many or all of the electroactive polymer actuators in the array. The storage capacitor 38 in parallel with the electroactive polymer actuator is optional, and the function is to help maintain the voltage applied to the electroactive polymer actuator.

The operation of the circuit is to transfer the data voltage to the driving electrode of the electroactive polymer actuator only when the gate of the selected transistor 34 is addressed, causing the TFT to become conductive. After addressing is completed, the transistor becomes insulating and the voltage is maintained on the electroactive polymer actuator until it either leaks away or until the electroactive polymer actuator is addressed again. In such a manner the circuit operates as a sample-and-hold circuit, whereby the (optional) storage capacitor helps to maintain the voltage applied to the electroactive polymer actuator.

After addressing, the electroactive polymer actuator will deform to a new actuation state depending upon the driving voltage (Vdr) which is present between the data electrode and the reference electrode. Note that the actuation may well take significantly longer than the period of addressing (which will typically be much less than 1 msec). Different levels of actuation can be realized by applying different driving voltages.

Addressing the array proceeds as shown in FIG. 4 which shows an example of a 4×4 array with a reference electrode set at Vref=0V. The starting point (not shown) is that all electroactive polymer actuators are discharged and hence in their non-actuated state. Open circles represent actuators which are not actuated, filled circles are actuators which are actuated.

All rows are initially addressed with a non-selection voltage (Vns: typically −10V for typical TFT). In this situation, no data can be transferred to the electroactive polymer actuators.

Figure 4A:
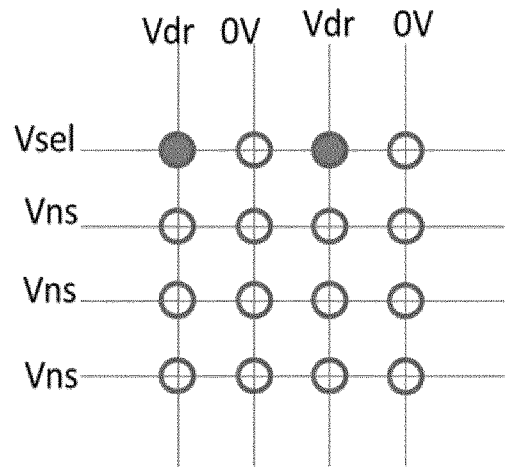
FIG. 4 shows a generic active matrix addressing scheme.

The first row is then addressed with a selection voltage (Vsel typically +30V for a typical TFT). This is shown in FIG. 4A. The other rows are not selected (Vns). Two columns are driven with a drive voltage Vdr, and the other two columns are driven with 0V and these voltages are transferred onto the first electrode of the respective electroactive polymer actuators. In this situation, the voltage difference across two of the electroactive polymer actuators is Vdr: these two electroactive polymer actuators in the row will be in the actuated mode (actuation may take some time after addressing is finished). The voltage difference across the other two electroactive polymer actuators is 0V, whereby these two electroactive polymer actuators in the row will remain in the non-actuated mode.

Figure 4B:
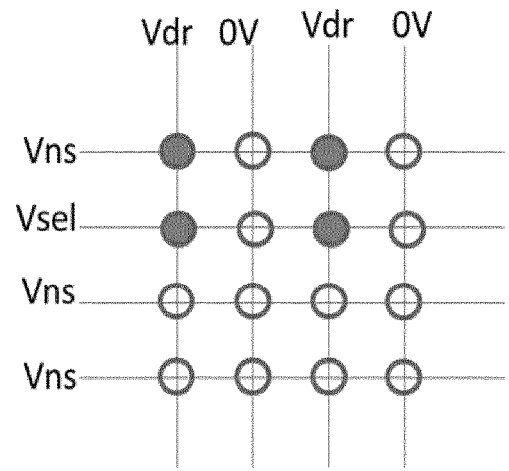

The second row is then addressed with a selection voltage (Vsel) as shown in FIG. 4B. The other rows are not selected (Vns). Again, two columns are driven with a drive voltage Vdr, and two columns are driven with 0V and these voltages are transferred onto the first electrode of the respective electroactive polymer actuators. In this situation, the voltage difference across two of the electroactive polymer actuators s is Vdr: these two electroactive polymer actuators in the row will be in the actuated mode (actuation may take some time after addressing is finished). The voltage difference across the other two electroactive polymer actuators is 0V, whereby these two electroactive polymer actuators in the row will remain in the non-actuated mode.

By deselecting the first row, the sample-and-hold nature of the addressing ensures that the electroactive polymer actuators in the first row maintain their voltage (especially if a storage capacitor is included) and remain in their state of actuation (or proceed towards it if not already reached).

Figure 4C:
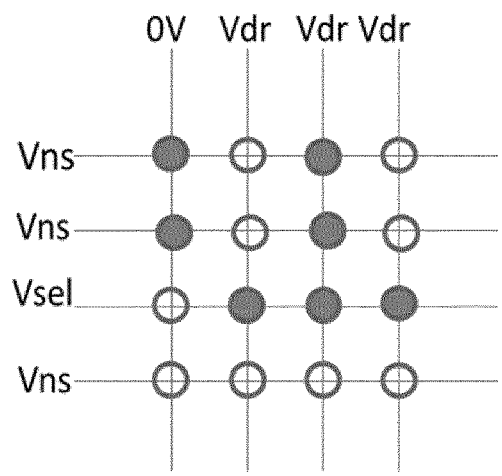

The third row is then addressed with a selection voltage (Vsel) as shown in FIG. 4C. The other rows are not selected (Vns). Now three columns are driven with a drive voltage Vdr, one column is driven with 0V and these voltages are transferred onto the first electrode of the respective electroactive polymer actuators. In this situation, the voltage difference across three of the electroactive polymer actuators is Vdr: these three electroactive polymer actuators in the row will be in the actuated mode (actuation may take some time after addressing is finished). The voltage difference across the other electroactive polymer actuator is 0V, whereby this electroactive polymer actuator will remain in the non-actuated mode. By deselecting the second row, the sample-and-hold nature of the addressing again ensures that the electroactive polymer actuators in this row maintain their voltage.

Figure 4D:
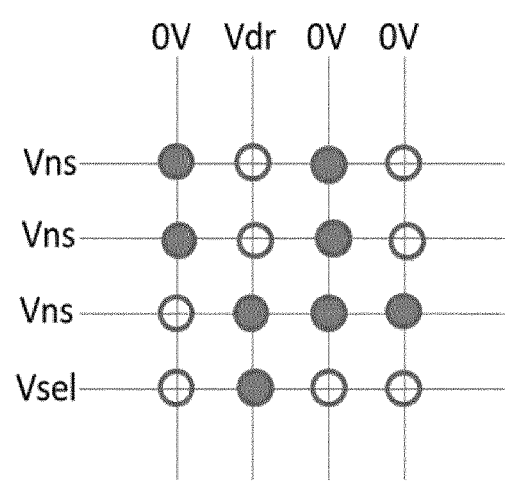

The fourth row is then addressed with a selection voltage (Vsel) as shown in FIG. 4D. The other rows are not selected (Vns). Only one column is driven with a drive voltage Vdr, and the other three columns with 0V. The voltage difference across only one of the electroactive polymer actuators is Vdr.

At the end of the addressing phase, all rows can be deselected (Vns) and voltages can be removed from the columns whereby the electroactive polymer actuators will remain in their state of actuation until their voltage leaks away, at which point the array may be re-addressed as described above.

It is possible to address several rows of electroactive polymer actuators at the same time, whereby the addressing will proceed even more quickly. This is achieved by applying an addressing voltage to more than one row of electroactive polymer actuators at the same time. This is possible if the same pattern of data is to be applied.

In the above example only a two level data driver is considered (0V and Vdr). This will result in the lowest cost driver IC's. However in further examples it may be preferred to also partially actuate the electroactive polymer actuators. To enable this, a data driver with multiple data voltages up to Vdr may be used.

Furthermore, whilst in the example above a voltage of one polarity is applied to the electroactive polymer actuators, in further embodiments it may be preferred to invert the polarity of the voltage across the electroactive polymer actuators at regular intervals whereby the performance of the electroactive polymer actuator will deteriorate less than if inversion is not used. This can be achieved by example by changing the voltage on the reference electrode in a further round of addressing and adapting the driving voltages accordingly.

The basic active matrix addressing scheme described above requires transistors to be able to withstand the same voltages as those which are used to drive the electroactive polymer actuators.

This invention relates to the use of switching devices, such as low voltage poly-silicon transistors, which operate at lower voltages than the drive voltages of the electroactive polymer actuators.

High voltage heating techniques are known which make use of transistor control switches which operate at lower voltages than required by the heater.

Figure 5A:
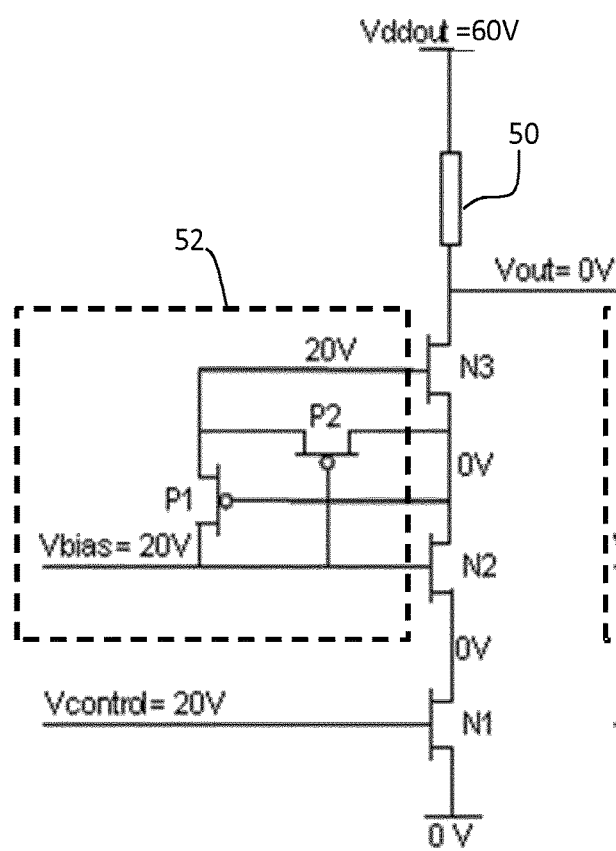
FIG. 5 shows a first example of a high voltage circuit using low voltage transistors.
Figure 5B:
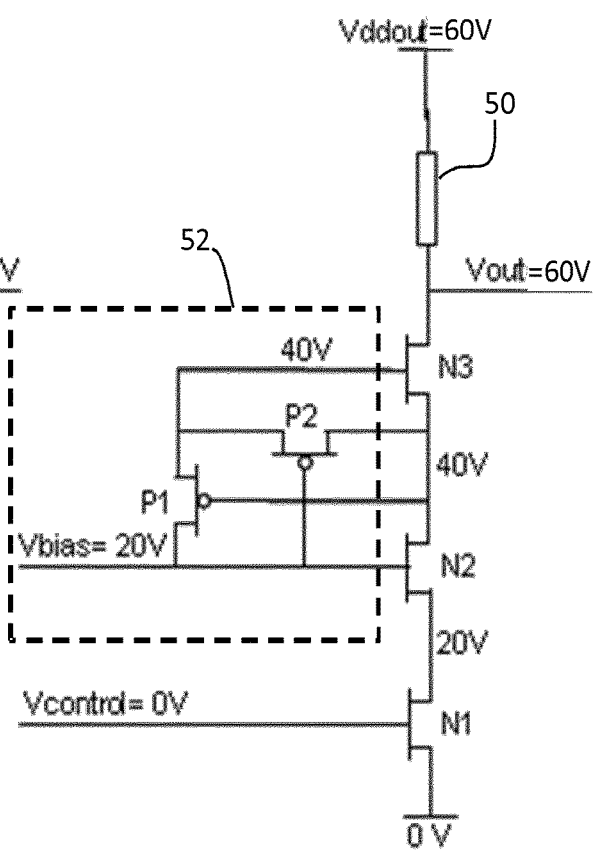

FIG. 5 shows a first example of a drive circuit for a 60V heater. FIG. 5(a) shows the heater turned off, and FIG. 5(b) shows the heater turned on.

The transistors used in the circuit are 20V TFTs which is for example the voltage limit for a low temperature poly-silicon (LTPS) TFT.

The circuit comprises a pull up resistor 50 connected to high voltage 60V line Vddout, and a pull down circuit which comprises three n-type transistors N1 to N3 in series. The bottom transistor N1 has a control voltage applied, which switches between 0 and 20V. The second transistor N2 has a constant bias voltage applied. A bias circuit 52 controls the voltage applied to transistor N3 and it includes two p-type transistors P1 and P2. The first p-type transistor P1 is between the gates of the second and third n-type transistors N2, N3 with its gate connected to the node between the transistors N2, N3. When P1 is closed, the bias voltage is applied to the gates of both transistors N2, N3 so they are both closed. The second p-type transistor P2 is between the gate and source of the third n-type transistors N3 with its gate connected to the gate of the second n-type transistor N2. When P2 is closed, there is no source-drain voltage for transistor N3 so transistor N3 is open.

FIG. 5A shows the voltages in the circuit when the input control voltage is high (20V), in which case P1 is turned on and P2 is turned off. This means that N1-N3 all have a gate voltage of 20V and the output voltage is pulled down to ground (0V) as are the nodes between N1 and N2 and between N2 and N3.

FIG. 5B shows the voltages in the circuit after the input control voltage is switched low (0V), in which case N1 turns off and the output voltage is pulled high. The circuit as a whole functions as an open circuit because there is no connection to ground as a result of N1 being turned off. In the absence of the pull up resistor 50 and its connections, the output would be floating.

In turn, the node between N2 and N3 is pulled high, which causes P1 to turn off and P2 to turn on. From symmetry, the steady state voltage between N2 and N3 will settle at 40V and the steady state voltage between N2 and N1 will settle at 20V, in which case the leakage currents through transistors N1 to N3 are all equal.

FIG. 6 shows an example of a drive circuit for an 80V heater. The pull down circuit comprises four n-type transistors N1 to N4 in series and the bias circuit 54 controls the voltage applied to transistors N3 and N4 and it includes four p-type transistors P1 to P4. The bias circuit comprises two of the bias circuits 52 of FIG. 5 stacked one above the other. Again, either all the n-type transistors are turned on to pull the output low, or else the bottom transistor is turned off and the voltage drop is shared across each n-type transistor.

Figure 6A:
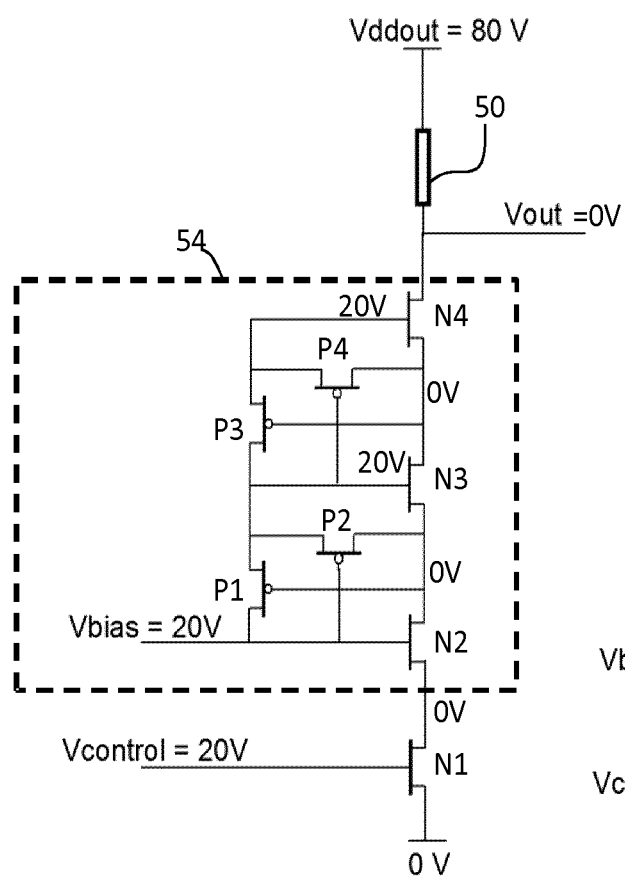
FIG. 6 shows a second example of a high voltage circuit using low voltage transistors.
Figure 6B:
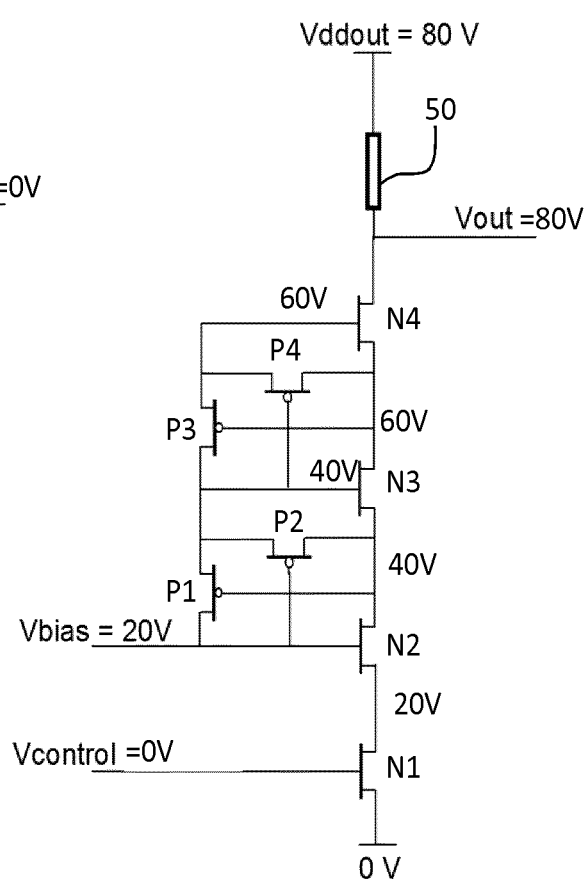

FIG. 6A shows the voltages in the circuit when the input control voltage is high (20V), and FIG. 6B shows the voltages in the circuit after the input control voltage is switched low (0V), When using these circuits for heating, a high voltage is dropped across the resistor and it is assumed that the resistor can sustain the high voltage, which is usually the case. However for an electroactive polymer device, the device has a capacitive equivalent circuit.

Figure 7:
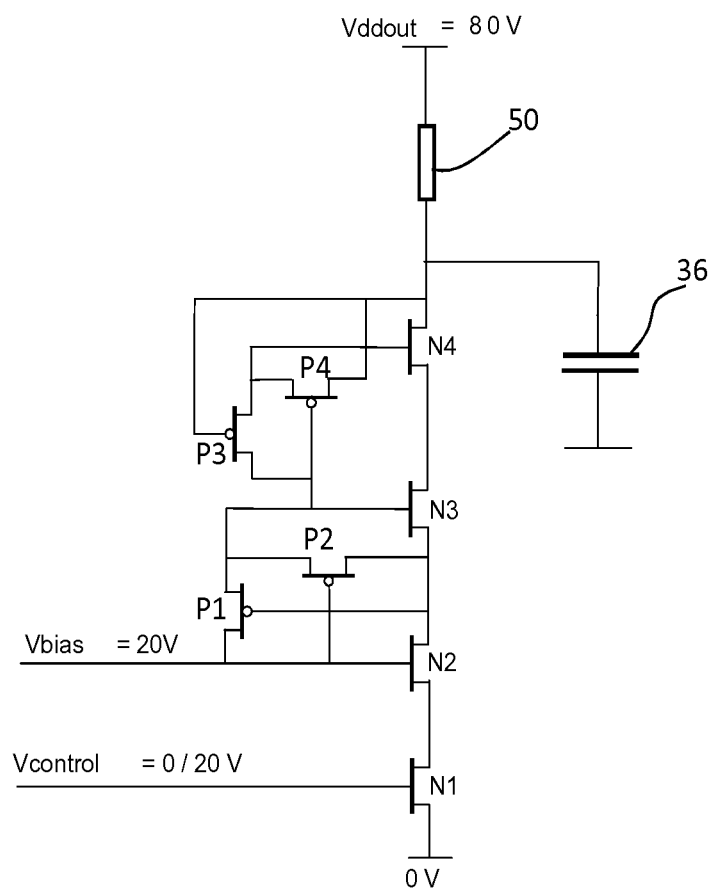
FIG. 7 shows a modification to the circuit of FIG. 6 to make it suitable for driving an electroactive polymer actuator.

The approach then may be to use the circuit of FIG. 7, in which the load is the EAP actuator, which is now in addition to the pull up resistor.

The problem of a circuit such as the one shown in FIG. 7 is that there is static power consumption when the pull down circuit is in the on state i.e. when one or both terminals of the EAP actuator is pulled down to 0V. Also the circuit has no storage of the drive signal.

Figure 8:
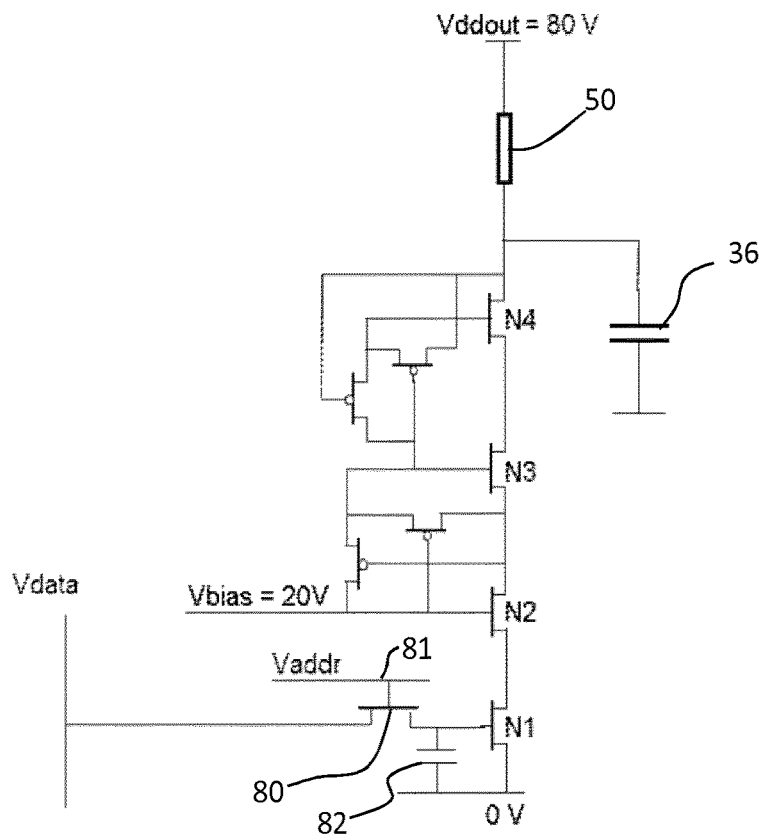
FIG. 8 shows a modification to the circuit of FIG. 7 to provide a signal storage function.

The storage issue is easily resolved as is shown in FIG. 8.

An addressing transistor 80 is provided, which enables a data voltage Vdata which is for example on a column line to be applied to a local storage capacitor 82. The gate of the addressing transistor 80 is coupled to an addressing line 81 to which an addressing voltage Vaddr is provided. The addressing line is for example a row conductor.

The electroactive polymer actuator can be driven between the supply at 80V in this example and 0V with a low voltage addressing scheme, where Vaddr (for example in the range 0 to 20V) is the standard row address signals of a matrix array and Vdata is also for example in the range 0 to 20V.

The issue of static power consumption remains, and the circuit can only achieve two voltage levels across the electroactive polymer device.

Figure 9:
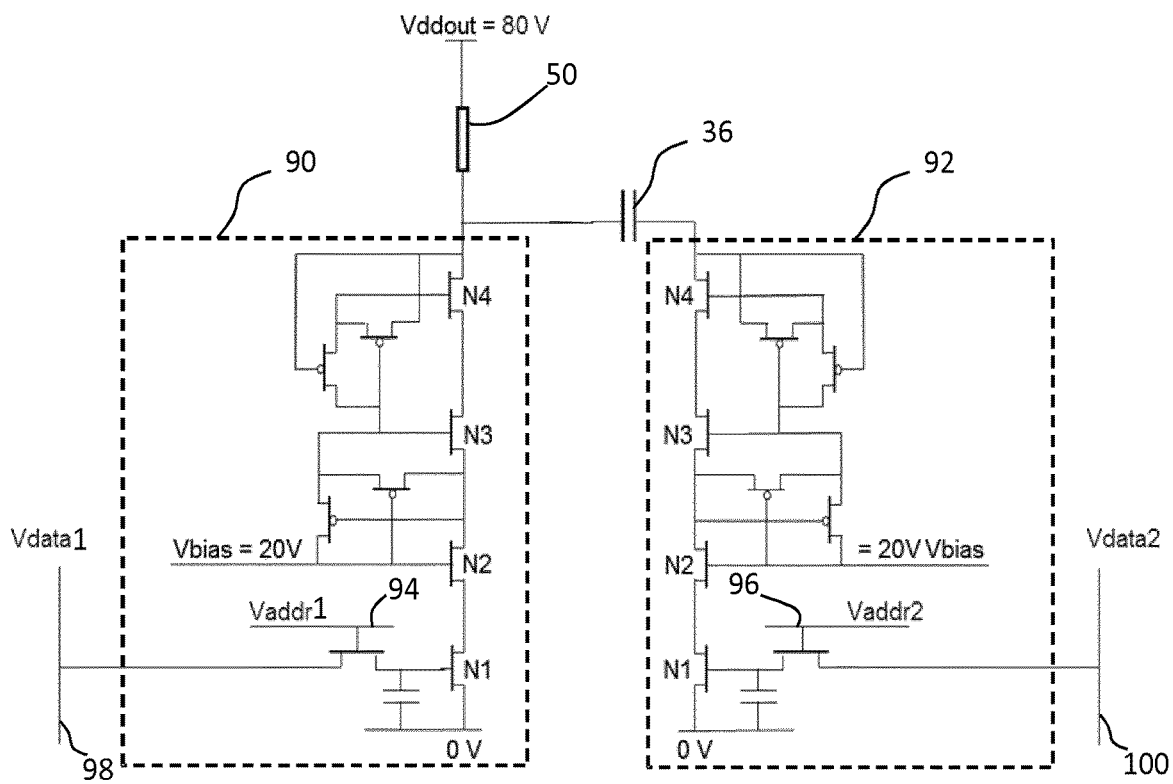
FIG. 9 shows a first example of an electroactive polymer actuator driving circuit.

The invention provides a circuit approach which resolves one or more of these issues, a first example of which is shown in FIG. 9.

The circuit comprises a first circuit 90 as shown in FIG. 8, and a second circuit 92 as shown in FIG. 8, but sharing a common pull up resistor 50 which connects to one terminal of the electroactive polymer actuator (defined as the first terminal). The overall circuit thus has two row addressing lines 94, 96 and two column data lines 98, 100.

The output of the first circuit 90 is connected to one side of the electroactive polymer actuator 36, and the output of the second circuit 92 is connected to the other side of the electroactive polymer actuator 36. In this way, the overall drive circuit has access to both sides of the electroactive polymer actuator 36 and as a result it becomes possible to overcome problem of static power consumption.

By addressing with low voltage signals Vaddr1,2 and Vdata1,2 driving with two levels is made possible without static power consumption.

By providing Vdata1 and Vdata2 high (when the respective row address signals are on), both sides of the electroactive polymer actuator will be coupled to ground. Vdata2 can then be driven to a low value (whilst Vaddr2 is still on). 0V will remain across the electroactive polymer actuator but the second terminal will be floating so that no current can flow through the electroactive polymer actuator itself.

Taking Vdata1 low as well (whilst Vaddr1 is still on) will not only shut off the current flow through the electroactive polymer actuator but will also prevent current consumption from the main supply. The electroactive polymer actuator will have 0V stored, but no current will flow through the electroactive polymer actuator and it will float up to the high supply (on both terminals).

Note that only the first circuit 90 needs to be switched to the high impedance state to achieve a high voltage across the actuator, whereas both circuits 90, 92 are held in the high impedance state for a low (i.e. zero) voltage to be maintained across the actuator. Therefore when addressing with Vaddr1 and Vaddr2 to achieve a high voltage on the actuator, Vdata1 should start high and transition to low within the address period. For a low voltage, both Vdata1 and Vdata2 start high and transition to a low value during the address period.

To address the electroactive polymer actuator with a high voltage, a modified drive scheme is provided.

Setting Vdata1 low (so that the circuit 90 is an open circuit) and Vdata2 high (so that the circuit 92 is grounding its terminal of the electroactive polymer actuator) when the respective row address signals are on, will cause the drive voltage Vddout (e.g. 80V) to be provided across the electroactive polymer actuator.

These voltages can then be held to cause the 80V to be stored with no current drawn after the address signal go low.

The circuit 92 can then be driven to the open circuit state. This will prevent current flow through the actuator since one terminal is floating. This again prevents static power consumption.

Figure 10:
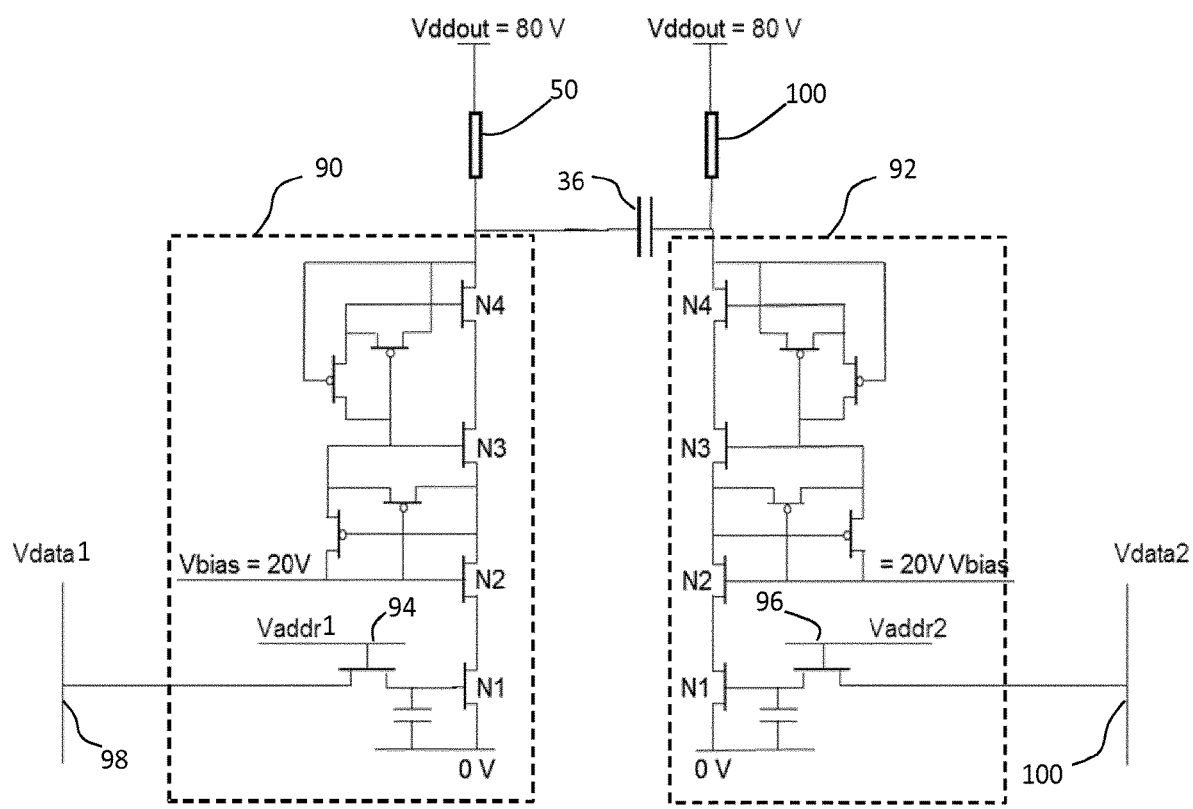
FIG. 10 shows a second example of an electroactive polymer actuator driving circuit.

FIG. 10 shows a modification to the circuit of FIG. 9, in which each circuit 90, 92 has its own respective pull up device 50, 100, so that there is one pull up device connected to each terminal of the electroactive polymer actuator 36.

This enables a three level drive scheme to be achieved.

By way of example, voltage levels 80V, 0V, and −80V can be provided across the electroactive polymer device.

This circuit arrangement may therefore be used to provide a high voltage inversion driving scheme. It has previously been observed that such inversion driving improves both the amplitude of the actuation and reduces and drift in actuation with prolonged usage.

The addressing can proceed in the following manner.

(i) To drive to +80V

Vaddr1,2 are driven high, Vdata1 is high (circuit 90 is grounded) and Vdata2 is low (circuit 92 is open circuit). The electroactive polymer actuator is thus charged to 80V (i.e. the terminal connected to the second circuit 92 is at a higher voltage than the terminal connected to the first circuit 90). Then Vaddr1,2 go low. The capacitors 82 maintain the same voltages.

(ii) To drive to 0V

Vaddr1,2 are driven high. Vdata1,2 are initially high so that both circuits are grounded. They are then made low so that both terminals of the electroactive polymer actuator are at the same voltage but there is no static power consumption because the electroactive polymer actuator terminals float up to the power supply voltage. Vaddr1,2 then go low.

The timing of operation of the circuits 90 and 92 is synchronized.

(ii) To drive to −80V

Vaddr1,2 are driven high. Vdata1 is low (circuit 90 is open circuit) and Vdata2 is high (circuit 92 is grounded). The electroactive polymer actuator is thus charged to −80V (i.e. the terminal connected to the second circuit 92 is at a lower voltage than the terminal connected to the first circuit 90). Then Vaddr1,2 go low. The capacitors 82 maintain the same voltages.

If the two supply voltages that are shown at 80V in FIG. 10 are changed to different levels (each 80V or less) then different sets of voltages across the electroactive polymer actuator can be derived e.g. supplies of 80V and 60V would achieve 80V, 0V and −60V on the electroactive polymer actuator.

The approach described above realizes a limited number of driving levels. However, intermediate actuation levels may be obtained by applying pulse width modulation (PWM) schemes. A PWM approach may for example help for some types of device, particularly in order to maintain a steady state.

The examples above make use of a series of pull down transistors to enable low voltage transistors to be used. Another approach is to make use of counter electrode driving.

Figure 11:
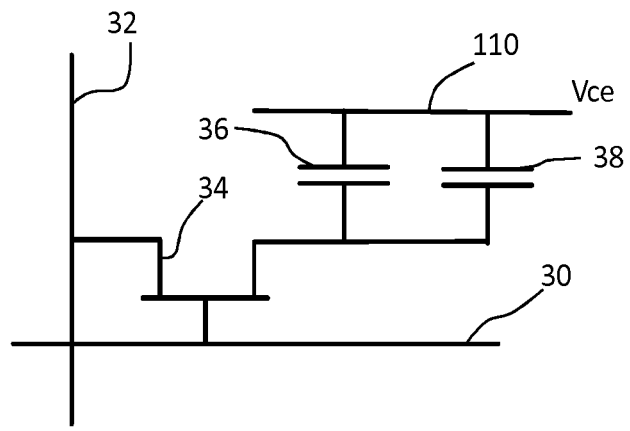
FIG. 11 shows a third example of an electroactive polymer actuator driving circuit for implementing a common electrode drive scheme.

FIG. 11 shows a basic active matrix switching circuit comprising a row conductor 30, column conductor 32, transistor 34 and the electroactive polymer actuator 36. One terminal of the electroactive polymer actuator is connected to the transistor 34 and the other is connected to a common counter electrode 110 to which a counter electrode voltage Vce is applied. A storage capacitor 38 may again be provided. The transistor may be a thin film transistor, and it may be polysilicon or amorphous silicon.

The counter electrode 110 may be common to a sub-set of the electroactive polymer actuators, for example all electroactive polymer actuators in an addressing row, or it may be common to all electroactive polymer actuators in the array. Traditional driving of such an active matrix circuit limits the driving voltage to around 40 V.

A high driving voltage method for the active matrix array may be achieved by driving the array from both the counter electrode connection and from the data driver. In this manner, a high driving voltage may be provided to selected electroactive polymer actuators in the array without introducing a high voltage to the driving electrode. This ensures that the addressing transistor 34 is not subjected to high voltages, since the high voltage is only present on the counter electrode. As a result, it will not leak, age or fail completely.

The counter electrode may be set to a different (second) non-zero voltage before applying the driving voltages from the data driver. In this manner, a higher voltage across the electroactive polymer actuator may be achieved with a data driver of a given voltage.

In particular, the actuation voltage is equal to the drive voltage less the counter electrode voltage. In this case, it is beneficial if the electroactive polymer actuator has a threshold voltage which is at least as high as the second counter electrode voltage to avoid that all electroactive polymer actuators are actuated. Ways to implement threshold voltages are discussed below.

In a first example of the use of the circuit of FIG. 11, the electroactive polymer actuators are assumed to have a threshold voltage of 30V and an actuation voltage of 60V, which exceeds the normal range of the active matrix addressing. The threshold voltage represents an actuation level below which there is greatly reduced actuation compared to the actuation above the threshold. The high voltage driving proceeds as follows, assuming the electroactive polymer actuators to be in an initial, non-actuated state.

All data drivers in the array are set to a reference voltage e.g. 0V.

The counter electrode voltage Vce is 0V at this time. All addressing transistors 34 are then are driven to the addressing (conducting) state e.g. with their gate electrodes at 40V. This ensures that the voltage on the driving electrode of each electroactive polymer actuator remains at 0V by connection to the data driver voltages present on the column conductors 32.

The counter electrode voltage Vce (for example +60V) to be applied to all the electroactive polymer actuators is driven onto the common counter electrode 110. When this voltage is applied, a current flows into the device to charge up the capacitance until the counter electrode reaches the applied voltage and there is 60V across the electroactive polymer actuator. At this point, due to the slow response speed, all electroactive polymer actuators are in the same physically non-actuated state whilst the charge on the electroactive polymer actuators is consistent with the actuated state. As a result, all electroactive polymer actuators will begin to actuate unless they are de-activated in the addressing phase.

In this addressing phase, all addressing transistors 34 are first driven to the non-addressing (insulating) state e.g. with their gate electrodes at −5V.

The data is then applied to the array one line at a time in the normal manner (by addressing one line of addressing transistors at a time). In this case, the actuation data will be 0V, as this will cause those electroactive polymer actuators which must switch position to do so. By applying 0V to the electroactive polymer actuator, there will be 60V across the electroactive polymer actuator. A data voltage of 30V will instead result in a voltage of +30V across the device which will be below the threshold and the electroactive polymer actuator will either not actuate (if addressing is carried out immediately) or will return to the non-actuated state (if there is a delay before addressing).

Thus, the electroactive polymer actuators are all driven electrically to their actuated state. This state is either maintained after addressing, or it is reversed before the actuators have had time to respond physically.

In this example, the data line voltages comprise a first drive level which is 0V and a second drive level which is 30V.

The common electrode voltages comprise a third drive level which is 0V, and a fourth drive level which is 60V. More generally, the voltage of the fourth drive level is greater than the voltage of the second drive level.

The voltage of the fourth drive level (60V) is the maximum drive voltage so that when it is applied, the actuator is electrically driven to its maximum actuation state (when the data voltage is zero). The difference between the voltages of the second and fourth drive levels (60V−30V=30V in this example) is equal to or less than the threshold voltage so that when the data voltage is set at the second drive level (30V) there is de-addressing.

The addressing transistors are made conducting during the period when the counter electrode voltage switches, as otherwise the voltage on the driving electrode will also switch to the counter electrode voltage (as no current can flow away) and the addressing transistor will be damaged.

The common electrode voltage can remain at the high level. To turn off the device as a whole, all data lines may be driven to 0V to turn off the transistors, and then the common electrode voltage can be driven down to 0V in a controlled manner.

In a second implementation the electroactive polymer actuators are assumed to have a threshold voltage of 60V and an actuation voltage of 90V—which exceeds the normal range of the active matrix addressing. The high voltage driving proceeds as follows, assuming the electroactive polymer actuators to be in an initial, non-actuated state.

All data drivers in the array are set to a reference voltage e.g. 0V.

The counter electrode voltage Vce is 0V at this time. All addressing transistors are driven to the addressing (conducting) state e.g. with their gate electrodes at 40V. This ensures that the voltage on the driving electrode remains at 0V.

The counter electrode voltage Vce (−60V) to be applied to all the electroactive polymer actuators is driven onto the common counter electrode. When this voltage is applied, a current flows into the device to charge up the device capacitance until the counter electrode reaches the applied voltage (there is 60V across the electroactive polymer actuator). At this point, all electroactive polymer actuators are in the same state (i.e. non-actuated) with a charge on the electroactive polymer actuators which is consistent with this actuation state.

All addressing transistors are then driven to the non-addressing (insulating) state e.g. with their gate electrodes at −5V.

The data is applied to the array one line at a time in the normal manner (by addressing one line of addressing transistors at a time). In this case, the actuation data will be 30V, as this will cause those electroactive polymer actuators which must switch position to do so (90V across the device).

A data voltage of 0V will result in a voltage of 60V across the device, which will be below the threshold and the device will not actuate.

This method differs from the first in that the initial driving is to the non-actuated state, and the row-by-row addressing is to switch the electroactive polymer actuators to the addressed state.

In this example, the data line voltages comprise a first drive level which is 0V and a second drive level which is 30V.

The voltage of the fourth drive level (−60V) is a negative voltage of magnitude equal to or less than the threshold voltage (60V in this example) and the voltage of the second drive level is a positive voltage (30V in this example) such that difference between the voltages of the second and fourth drive levels is equal to the maximum drive voltage (30V−−60V=90V). The fourth drive level alone is not sufficient to actuate the actuator.

The addressing transistors are again conducting during the period when the counter electrode voltage switches, as otherwise the voltage on the driving electrode will also switch to the counter electrode voltage (as no current can flow away) and the addressing transistor will be damaged.

The operation of the circuit is to transfer the data voltage to the driving electrode of the electroactive polymer actuator only when the gate of the selected TFT is addressed, causing the TFT to become conductive. After addressing is completed, the TFT becomes insulating and the voltage is maintained on the device until it either leaks away or until the device is addressed again. In such a manner the circuit operates as a sample-and-hold circuit, whereby the (optional) storage capacitor helps to maintain the voltage applied to the device.

After addressing, the device will deform to a new actuation state depending upon the driving voltage (Vdr) which is present between the data electrode and the reference electrode. The actuation may well take significantly longer than the period of addressing, which will typically be much less than 1 msec. Different levels of actuation can be realized by applying different driving voltages.

As will be clear from the description above, some designs may make use of a threshold behavior of the device. The electroactive polymer actuator does not inherently exhibit threshold behavior. Some ways to create a structure with the desired threshold behavior will now be discussed.

An artificially created threshold may be created, to avoid unwanted actuation effects up to this threshold, using either mechanical effects or electrical (driving signal) effects, or combinations of these.

Mechanical threshold effects may for example be implemented using geometry, mechanical clamping, or surface "stickiness". Electrical threshold effects may for example be implemented using electrostatic attraction or electrical breakdown behavior. A combination of these effects may also be used to efficiently implement a voltage threshold.

This threshold may be considered to be a delay, in that physical actuation is delayed until a certain drive level is reached.

Figure 12:
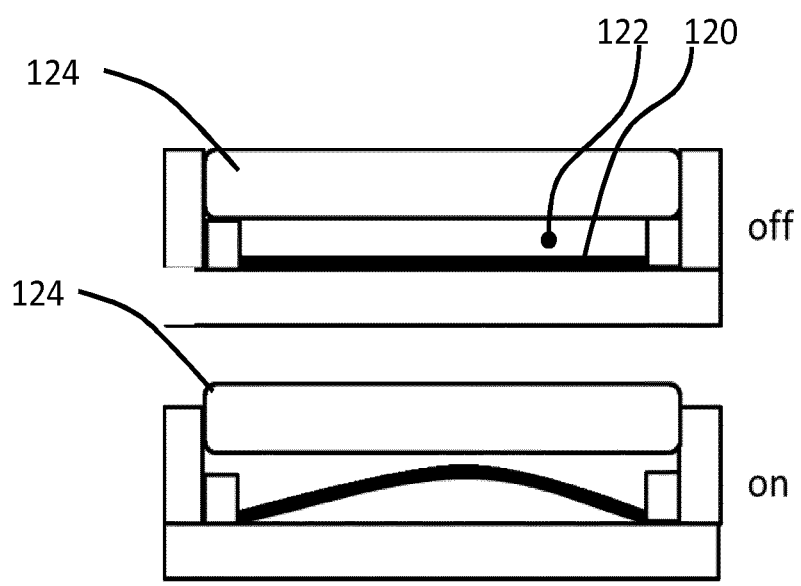
FIG. 12 shows a first example of electroactive polymer device with a threshold behavior.

FIG. 12 shows a first example based on a geometric effect, using a mechanical structure to implement the delay.

The device comprises an electroactive polymer layer 120 within a chamber 122. The chamber has a lid 124 suspended over the electroactive polymer layer 120. The lid is seated on a rim which means it is suspended over the EAP layer. Driving of the electroactive polymer layer with a first range of applied drive signals raises it towards the lid. After contact has been made (at the maximum drive signal within the first range), further actuation causes the lid to raise as shown in the lower image. Thus, there is a range of input drive signals which only cause movement of the electroactive polymer layer within the gap beneath the lid. When the maximum drive signal in this range is reached, contact is made. This corresponds to the threshold voltage of the overall device. Above this drive signal, further driving in a second range provides progressing lifting of the lid, which corresponds to the mechanical output of the device.

Thus, a partially actuated element will not displace the lid, but a fully actuated actuator will give displacement, though the penalty is a limited full displacement of the actuated surface.

Figure 13:
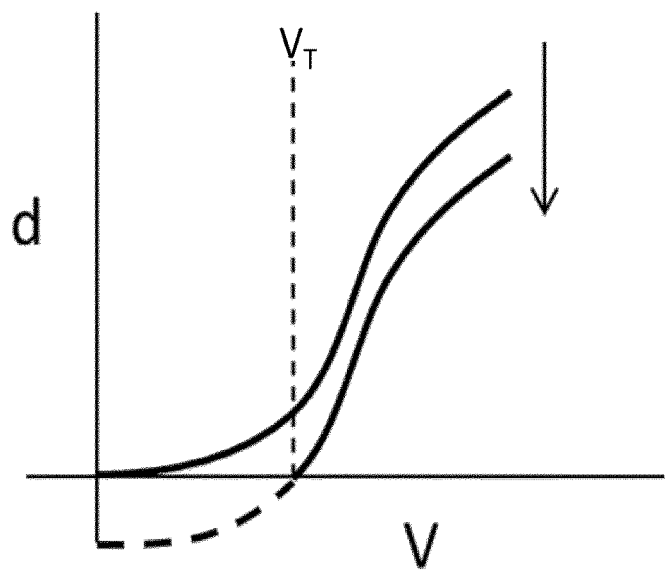
FIG. 13 shows how the device of FIG. 12 alters the displacement-voltage characteristic.

As shown FIG. 13, the effect of the delay is to lower the displacement curve so that there is no displacement until a threshold $V_T$ is reached. This has the effect of lowering the maximum displacement.

The actuator can provide more displacement if it is clamped using a retainer system, for example a snap system to create a threshold voltage for actuation. This threshold voltage then corresponds to a required force to overcome the retainer function.

Figure 14:
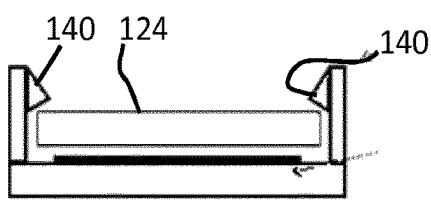
FIG. 14 shows a second example of electroactive polymer device with a threshold behavior.
Figure 14:
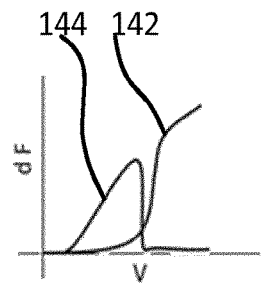

FIG. 14 shows an example having a retaining mechanism 140 in the form of snap hooks which the lid 124 must pass before displacing. The snap hooks require a threshold force to be applied to the lid before it can move past the hooks. The corresponding displacement versus voltage characteristic (plot 142) as well as force versus voltage characteristic (plot 144) are shown.

After the snap-through the actuator will keep increasing its displacement with more applied voltage. When the voltage is removed, the system returns to its initial flat state. The snap hooks may allow free passage in the downward direction of the lid, or else the device may need to be reset by an additional applied force.

In a further mechanical embodiment, the threshold voltage may be induced by adding a defined "stickiness" between the electroactive polymer structure (i.e. the polymer layer and its own substrate) and a support structure. The stickiness can only be overcome by increasing the voltage across the electroactive polymer layer until its force overcomes the stickiness of the system.

The stickiness could be implemented by chemical modification of the surfaces (applying a glue-like property), introducing a fluid between the surfaces (using capillary forces), mechanical/topological modification of the surface, for example a "Velcro" like structure.

Figure 15:
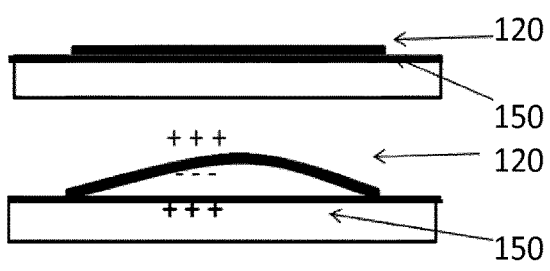
FIG. 15 shows a third example of electroactive polymer device with a threshold behavior.
Figure 15:
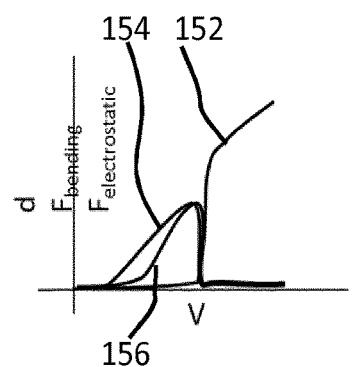

The examples above make use of a delay mechanism based on a mechanical structure, which for example defines the output of the device. An alternative is based on an electrostatic effect as shown in FIG. 15.

The actuator has an additional electrode 150 on the surface below the electroactive polymer structure. The electrostatic attraction between one electrode of the electroactive polymer layer 120 and the extra electrode 150 on the surface creates a restrictive force which constrains bending.

If the electrostatic force is overcome by the bending force, the actuator will bend. This reduces the electrostatic force drastically, as the force is a function of the separation between the electrodes (d) squared. Any bending will increase d and the electrostatic force is reduced, leading to further bending and hence more reduction of F electrostatic, and the threshold is overcome.

The graph shows the corresponding displacement versus voltage characteristic (plot 152), the force versus voltage characteristic (plot 154) and the electrostatic force versus voltage characteristic (plot 156).

An advantage of this system is that the electrostatic force is almost instantaneous and the electroactive polymer layer force is slow to respond, which is favorable for keeping the actuator tightly clamped at lower voltages. A dynamic effect can be realized by exploiting the difference in capacitance between the electroactive polymer layer and the substrate. In this configuration, the electrostatic force will work to constrain the EAP device as soon as a voltage is applied. The electroactive polymer actuator will however slowly build up to its maximum force from a step voltage input. This can cause a delayed threshold effect. Thus, when a step voltage is applied, the electrostatic force first holds the device down until the actuation force overcomes the electrostatic force threshold and pops up to give a displacement.

The threshold value is thus determined partly by the geometry of the actuator and partly by the speed of actuation.

Another possible implementation of a delay mechanism to provide a threshold comprises an electrical component which implements a threshold voltage or a breakover voltage for controlling the application of the applied drive signal to the electroactive polymer layer.

Figure 16:
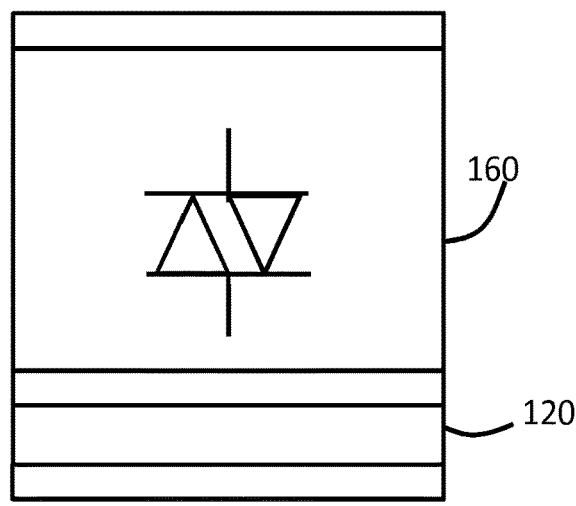
FIG. 16 shows a fourth example of electroactive polymer device with a threshold behavior.

FIG. 16 shows an example, in which the electroactive polymer layer 120 is connected electrically in series with an electrical threshold or breakover element 160 shown as a DIAC (diode AC switch). Other threshold elements may be used such as a Shockley diode, silicon controlled rectifier or other thyristor. This element may be part of the electroactive polymer structure, for example as organic semiconducting layers (in p-n-p-n sequence) as a part of the substrate stack. Alternatively for larger actuators in an array, the element can be a surface mount device component in series connection with each actuator.

For an applied voltage below the breakover or threshold voltage, there is no deformation induced as the voltage drop arises across the threshold or breakover element. For a larger applied voltage, the electroactive polymer layer will deform.

Another possible implementation for the delay mechanism comprises a second electroactive polymer structure, wherein the second electroactive polymer structure comprises an electrode for receiving the applied drive signal to the device, wherein upon deformation of the second electroactive polymer structure by a predetermined amount, the applied drive signal is coupled to the (main) electroactive polymer structure.

Figure 17:
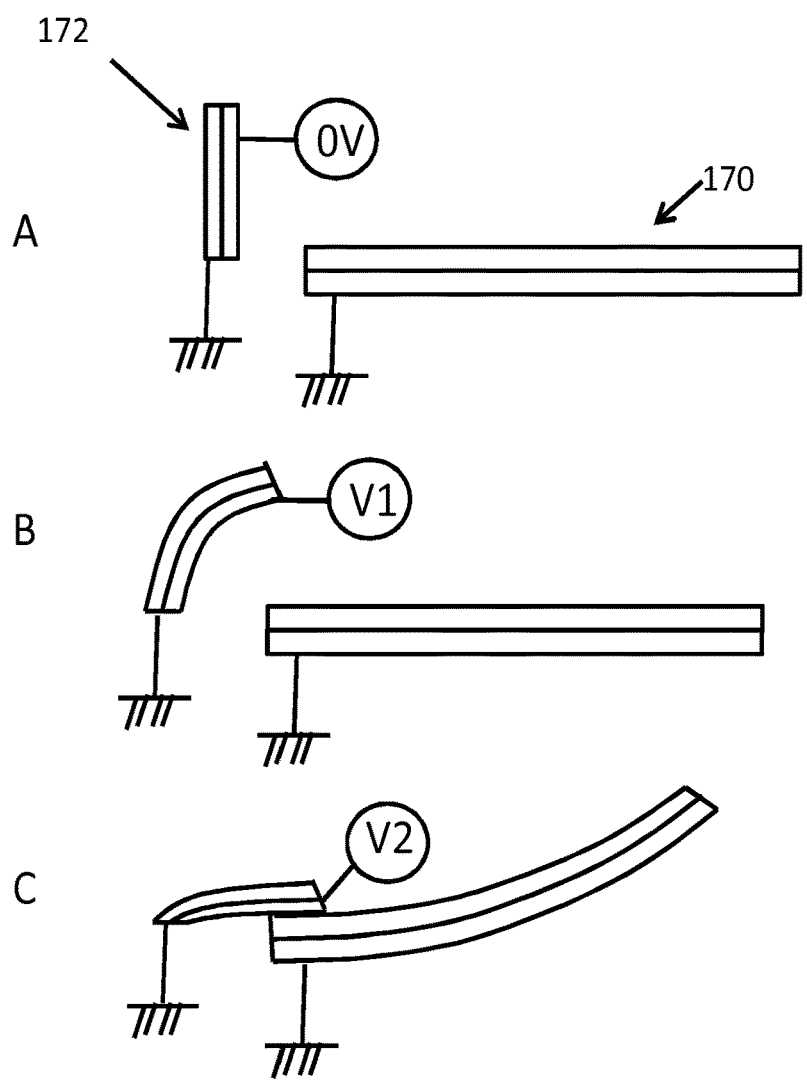
FIG. 17 shows a fifth example of electroactive polymer device with a threshold behavior.

FIG. 17 shows an example. The overall device comprises a main actuator 170 and a subsidiary actuator 172. The subsidiary actuator is smaller than the main actuator and it defines a control part which is a non-load bearing device.

The use of two sequential actuators enables a threshold to be implemented. The subsidiary actuator acts as a mechanical switch while the main actuator is the functional actuator. When the voltage is below the threshold voltage the switch is off, as shown for voltages V=0 and V=V1 in FIGS. 17A and 17B.

At and above the threshold voltage, for example V=V2 as shown in FIG. 17C, the switch is on and the functional actuator is at once fully powered to that voltage.

The contact between the two actuators provides contact of their driving electrodes, so that the subsidiary actuator delays the application of the drive voltage to the main actuator.

Figure 18:
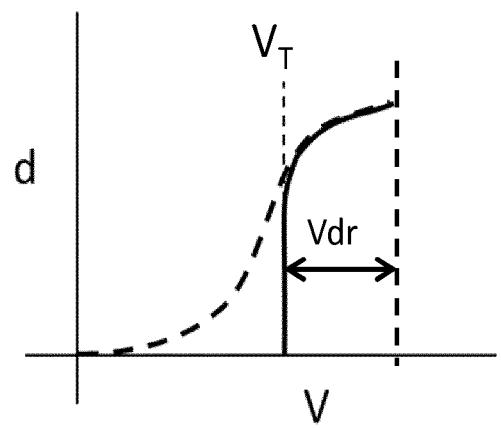
FIG. 18 shows how the device of FIG. 17 alters the displacement-voltage characteristic.

FIG. 18 shows the displacement function for the main actuator, and it can be seen that there is an abrupt cutoff of the displacement function.

The sequential ordering can be configured in several different ways with different actuator configurations and switching actuator geometries. The contact can be made by the electrode of the electroactive polymer structure or by an additional contact pad made on the back side of the substrate, depending on the actuator geometry.

As mentioned above, another way to implement the delay function is by introducing a sticking property.

Figure 19:
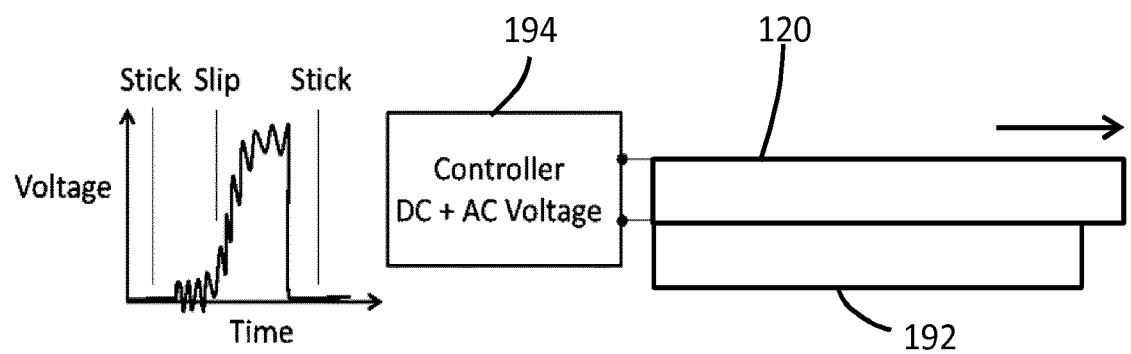
FIG. 19 shows a sixth example of electroactive polymer device with a threshold behavior.

FIG. 19 shows an implementation in which the expansion of the electroactive polymer layer 120 is constrained to be in-plane.

Figure 1:
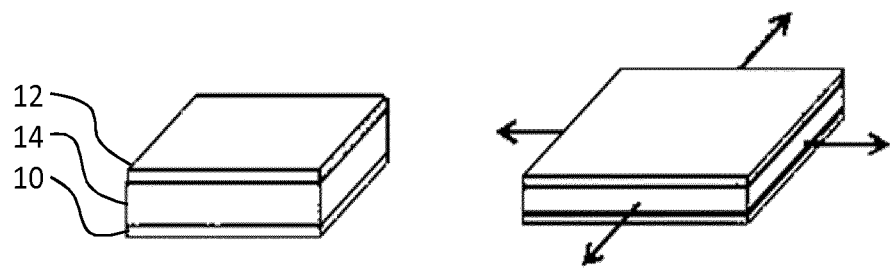
FIG. 1 shows a known electroactive polymer device which is not clamped.
Figure 2:
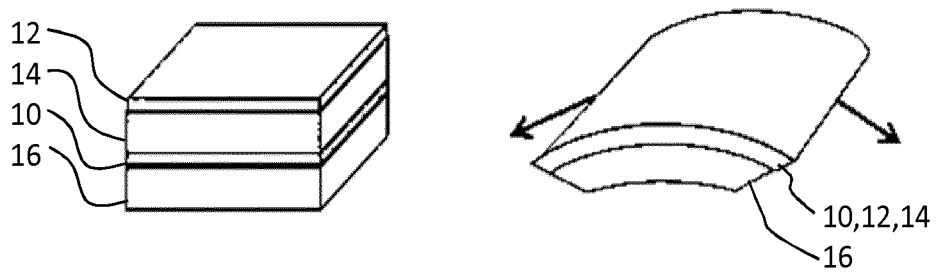
FIG. 2 shows a known electroactive polymer device which is constrained by a backing layer.

This design could be based on a free standing device (as in FIG. 1). For example, the two layers may be fixed at one side and otherwise be free to expand in all directions.

The layer is provided against a substrate 192 and there is frictional resistance between them which resists the relative sliding movement until the frictional force is overcome.

In this way, the friction functions as the delay mechanism, and determines the threshold.

In order to drive the device in a way which overcomes the friction, an ac drive scheme may be used. For example a controller 194 is used to apply a high frequency ac ripple added to a dc driving signal to enable relative slippage when the actuator moves from one position to a next position. The next position can also be held by removal of the applied voltage due to the friction, so that a bistable effect is obtained.

As shown in the voltage time profile in FIG. 19, the driving of the device starts with an ac voltage with only a small dc offset. Electroactive polymers actuate symmetrically for positive and negative voltages, so that there will result a vibration around the non-actuated state. This will result in a reduction of friction and prepare the electroactive polymer layer for a smooth actuation movement, which occurs as soon as the driving voltage increases.

The electroactive polymer layer then continues to deform during the next time period depicted in the graph, where there are active vibrations during the deformation (induced by the ac component superimposed on the rising dc voltage level).

Finally, following a short period where the ac signal is superimposed upon an essentially constant dc level, to allow for any delay in the movement of the electroactive polymer layer in reaching its final state, the voltage is removed which, if the residual friction is sufficient, will result in a second stationary state being retained. Subsequently the device can be reset by applying only a small ac signal to overcome the friction and bring the device back to its original state. Hence the device has multiple arbitrary stable states with a reset possibility. In this embodiment, it may be advantageous to reduce the ac signal amplitude slowly to allow the device to settle into its most stable (highest friction) state.

The various examples described above essentially provide an actuator device which has a threshold function.

The circuits above are based on the use of transistors. Whilst the MOSFET properties of amorphous silicon TFTs allow for devices to be driven to both higher voltages and lower voltages through the same switching TFT, there are other—lower cost—active elements such as diodes where this is not the case.

In principle it is possible to address an EAP device through a diode in series at the crossing point of rows and columns. However as the diode only conducts in one direction, reducing of the activation state of each device depends on the self-discharging function of an EAP device. This may result in long not-wanted on-times of pixels of an array.

FIG. 20 shows a switching arrangement which makes use of diodes. A first diode 200 is between a first addressing line 202 and a first terminal of the electroactive polymer actuator 36, and a second diode 204 is between the first terminal of the electroactive polymer actuator and a second addressing line 206. The diodes are thus in series between the two addressing lines 202, 206 with the same polarity. A second terminal of the electroactive polymer actuator is connected to a select line 208. The first and second addressing lines comprise column conductors and the select line comprises a row conductor.

There is thus a first diode between a first addressing line and a first terminal of the electroactive polymer actuator, and a second diode between the first terminal of the electroactive polymer actuator and a second addressing line, wherein a second terminal of the electroactive polymer actuator is connected to a select line. This arrangement uses two diodes; one for addressing and the other for de-addressing.

The first diode 200 is the addressing diode for charging the electroactive polymer actuator from the first addressing line, and the second diode 204 is the de-addressing diode for discharging the electroactive polymer actuator to the second addressing line (i.e. drive it to lower voltages).

In order to limit the on-time, as may be required depending on the application requirements, this circuit provides active deactivation or de-addressing of the electroactive polymer actuator. It allows for a rapid discharge of the electroactive polymer actuator (and if present its storing capacitor).

The addressing scheme is extended by a corresponding de-addressing scheme as explained with reference to FIG. 21 which shows a 4×4 matrix.

At each crossing point the circuit of FIG. 20 is provided. There are now two columns conductors 202, 206 for each column of actuators so that there are 2 m columns and n rows.

During each cycle, the rows are addressed in turn. When one row is being addressed, the electroactive polymer actuators in the row are either addressed or actively de-addressed.

FIG. 21 shows two parts of an addressing cycle in which the first row is selected.

FIG. 21A shows all electroactive polymer actuators in the first row being actuated.

During addressing, the second column conductors 206 are held high (Vh) so that the actuators cannot discharge. The first column conductors 202 of the selected columns are also brought high (Vh) to charge the electroactive polymer actuators in those columns. In the example of FIG. 21A all four actuators are addressed.

During de-addressing as shown in FIG. 21B, the first data columns 202 are held low (V1) so that in combination with the addressing line voltage the first diode 200 is not conducting. The second diodes 204 of the selected columns are conducting as a result of a low discharge voltage (Vd) applied to the selected second column conductors 206. The other second column conductors have a high voltage applied (Vh) so that the diodes 204 do not conduct.

The row conductor for the selected row has a selection voltage applied (Vsel) and all other rows have a non-selection voltage applied (Vns). As will be explained below, a different non-selection voltage is used during the charging and discharging stages. Only if the de-addressing row is activated AND the corresponding second data column 206 is switched to the de-activation voltage (Vd), the actuator at the crossing point will be deactivated (discharged). The low voltage Vd is not sufficient alone to forward bias the diode 204 when the low non-selection voltage Vns is applied to the row conductor.

The addressing and de-addressing operations are sequential. They cannot be at the same time as this would provide a short between the two column conductors.

By way of example, for an actuation voltage of 200V, the following voltage levels are possible: Vh=100V, V1=−100V, Vd=−100V and Vns=+100V or −100V depending on the stage of the driving sequence.

One possible driving sequence is:
1. Charging

The address line 208 for the row to be addressed is driven to Vsel=−100V

The data lines 202 are driven to Vh=100V and the data lines 206 are driven to Vh=100V. The actuators in the row charge to 200V. The address lines for the non-selected rows are at Vns=100V.

2. Discharging

The address lines 208 for the non-selected rows are driven to Vns=−100V.

The data lines 202 are driven to V1=−100V. Thus all diodes 200 are non-conducting, either with 0V across them or a reverse bias of 200V.

The data lines 206 for the actuators to be discharged are driven to Vd=−100V. The actuators in those rows are then discharged through the diodes 204. None of the other actuators are affected.

Figure 22:
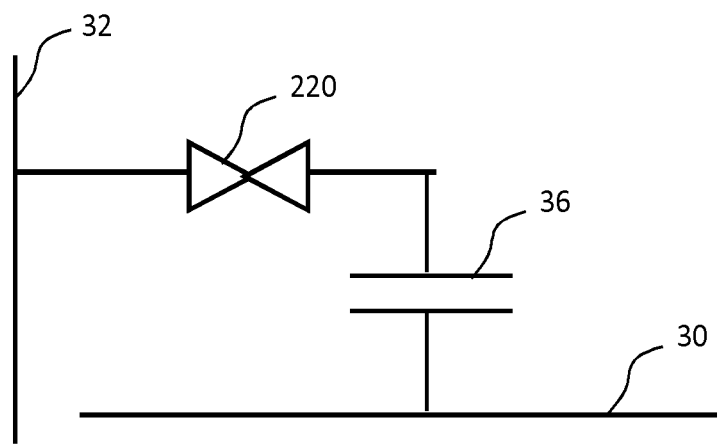
FIG. 22 shows a drive circuit for an electroactive polymer actuator using a MIM diode.

FIG. 22 shows another example in which the switching arrangement comprises a MIM (metal-insulator-metal) diode 220 in series with the electroactive polymer actuator 36 between a single column conductor 32 and row conductor 30. A MIM diode shows diode characteristics in both conduction directions with a blocking range at lower voltages.

Figure 23:
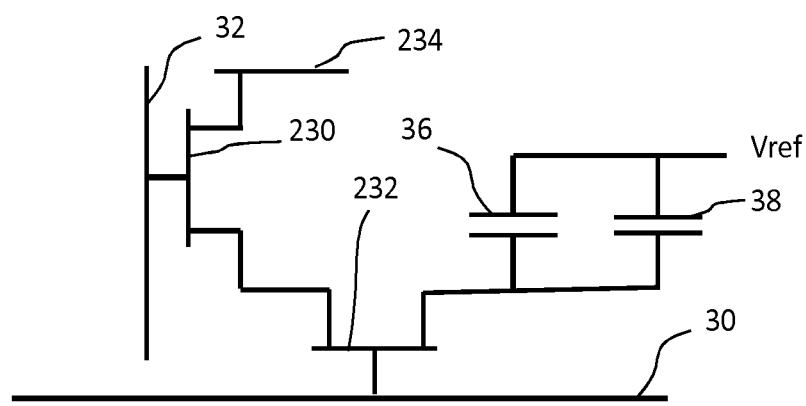
FIG. 23 shows a drive circuit for an electroactive polymer actuator using two drive transistors.

FIG. 23 shows another example of switching arrangement which comprises first and second transistors 230, 232 in series between a data line 234 and a first terminal of the electroactive polymer actuator 36, wherein the first transistor 230 is switched by a first, column addressing line 32 and the second transistor is switched by a second, orthogonal, row addressing line 30. A second terminal of the electroactive polymer actuator 36 is connected to a reference potential Vref. A storage capacitor 38 is also again shown in parallel with the electroactive polymer actuator. The switching arrangement thus comprises first and second transistors in series between a data line and a first terminal of the electroactive polymer actuator. The use of two transistors enables an automatic refreshing scheme to be implemented. This enables the actuation state to be held without re-addressing the array with data.

A driver arrangement is used to deliver first and second drive levels to the first and second addressing lines, and for delivering data to the data line.

In order to address the electroactive polymer actuator, both transistors need to be addressed simultaneously. Such a circuit allows an automatic refreshing scheme as e.g. implemented in Random Access Memories (RAM).

In all of the examples above, the driver may apply a data signal in the form of a two level signal (0V and Vdr). This will result in the lowest cost driver IC's as mentioned above. However in alternative embodiments it may be preferred to also partially actuate the actuators. To enable this, a data driver with multiple data voltages up to Vdr may be used or else a PWM drive scheme may be used.

In all of these active matrix addressing schemes, it may be desired to address several rows of electroactive polymer actuators at the same moment, whereby the addressing will proceed even more quickly. This is achieved by applying an addressing voltage to more than one row of electroactive polymer actuators at the same time.

As also mentioned above, it may be preferred to invert the polarity of the voltage across the electroactive polymer actuators at regular intervals whereby the performance of the device will deteriorate less than if inversion is not used. This can be achieved by example by changing the voltage on the reference electrode in a further round of addressing and adapting the driving voltages accordingly.

The electrode arrangement may comprise electrodes on opposite faces of the electroactive polymer layer as shown above, for a field driven device. These provide a transverse electric field for controlling the thickness of the EAP layer. This in turn causes expansion or contraction of the EAP layer in the plane of the layer.

The electrode arrangement may instead comprise a pair of comb electrodes on one face of the electroactive polymer layer. This provides in-plane electric field, for directly controlling the dimensions of the layer in-plane.

Materials suitable for the EAP layer are known. Electroactive polymers include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to:

acrylates, polyurethanes, silicones.

The sub-class conjugated polymers includes, but is not limited to:

polypyrrole, poly-3,4-ethylenedioxythiophene, poly(p-phenylene sulfide), polyanilines.

Additional passive layers may be provided for influencing the behavior of the EAP layer in response to an applied electric field.

The EAP layer may be sandwiched between electrodes. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The materials for the different layers will be selected for example taking account of the elastic moduli (Young's moduli) of the different layers.

Additional layers to those discussed above may be used to adapt the electrical or mechanical behavior of the device, such as additional polymer layers.

The EAP devices may be electric field driven devices or ionic devices. Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

If the plated electrodes are arranged in a non-symmetric configuration, the imposed voltage can induce all kinds of deformations such as twisting, rolling, torsioning, turning, and non-symmetric bending deformation.

The device may be used as a single actuator, or else there may be a line or array of the devices, for example to provide control of a 2D or 3D contour.

The invention can be applied in many EAP applications, including examples where a passive matrix array of actuators is of interest.

In many applications the main function of the product relies on the (local) manipulation of human tissue, or the actuation of tissue contacting interfaces. In such applications EAP actuators provide unique benefits mainly because of the small form factor, the flexibility and the high energy density. Hence EAP's can be easily integrated in soft, 3D-shaped and/or miniature products and interfaces. Examples of such applications are:

Skin cosmetic treatments such as skin actuation devices in the form of EAP-based skin patches which apply a constant or cyclic stretch to the skin in order to tension the skin or to reduce wrinkles;

Respiratory devices with a patient interface mask which has an EAP-based active cushion or seal, to provide an alternating normal pressure to the skin which reduces or prevents facial red marks;

Electric shavers with an adaptive shaving head. The height of the skin contacting surfaces can be adjusted using EAP actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of EAP transducers which is integrated in or near the user interface;

Catheters with a steerable tip to enable easy navigation in tortuous blood vessels.

Another category of relevant application which benefits from EAP actuators relates to the modification of light. Optical elements such as lenses, reflective surfaces, gratings etc. can be made adaptive by shape or position adaptation using EAP actuators. Here the benefits of EAP actuators are for example the lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An actuator device comprising:
an active matrix array of electroactive polymer actuators, wherein each electroactive polymer actuator of the electroactive polymer actuators has a switching arrangement, the switching arrangement comprising:
a first circuit connected between a first terminal of each electroactive polymer actuator and ground, wherein the first circuit is arranged to selectively drive the first terminal of each electroactive polymer actuator to the ground;
a second circuit connected between a second terminal of each electroactive polymer actuator and the ground, wherein the second circuit is arranged to selectively drive the second terminal of each electroactive polymer actuator to the ground; and
a first pull up component connected between a first drive voltage and the first terminal of each electroactive polymer actuator.

2. The actuator device as claimed in claim 1, further comprising a second pull up component connected between a second drive voltage and the second terminal of each electroactive polymer actuator.

3. The actuator device as claimed in claim 2, wherein the first drive voltage and the second drive voltage are same.

4. The actuator device as claimed in claim 2, wherein the first drive voltage and the second drive voltage are different.

5. The actuator device as claimed in claim 1, wherein each of the first and second circuits comprises a plurality of series-connected transistors, and wherein each of the plurality of series-connected transistors is connected between a terminal of each electroactive polymer actuator and the ground.

6. The actuator device as claimed in claim 5, wherein each of the first circuit and the second circuit comprises:
an addressing transistor and a storage capacitor,
wherein the plurality of series-connected transistors comprises a first transistor and at least two second transistors, and
wherein the addressing transistor and the storage capacitor are arranged to provide a data voltage to gate of the first transistor; and
a bias control circuit for controlling gate voltages of at least one second transistor of the at least two second transistors, wherein the first transistor is not one of the at least two second transistors.

7. The actuator device as claimed in claim 6, wherein the bias control circuit of each of the first circuit and the second circuit comprises:
a bias voltage coupled to gate of at least one of the at least two second transistors; and
at least one control transistor between an adjacent pair of the plurality of series: connected transistors.

8. The actuator device as claimed in claim 7, wherein the plurality of series-connected transistors are n-type transistors and the at least one control transistor is a p-type transistor.

9. The actuator device as claimed in claim 5, wherein the plurality of series-connected transistors are thin film transistors.

10. An actuator device comprising:
an active matrix array of electroactive polymer actuators, wherein each electroactive polymer actuator of the electroactive polymer actuators has a switching arrangement, the switching arrangement comprising:
a first circuit connected between a first terminal of each electroactive polymer actuator and ground, wherein the first circuit is arranged to selectively connect the first terminal of each electroactive polymer actuator to an open circuit;
a second circuit connected between a second terminal of each electroactive polymer actuator and the ground, wherein the second circuit is arranged to selectively connect the second terminal of each electroactive polymer actuator to the open circuit; and
a pull up component connected between a drive voltage and the first terminal of each electroactive polymer actuator.

* * * * *